United States Patent
Prabhakar

(10) Patent No.: US 7,894,257 B1
(45) Date of Patent: Feb. 22, 2011

(54) LOW VOLTAGE LOW COST NON-VOLATILE MEMORY

(76) Inventor: Venkatraman Prabhakar, 3720 Appian St., Pleasanton, CA (US) 94588

(*) Notice: Subject to any disclaimer, the term of this patent is extended or adjusted under 35 U.S.C. 154(b) by 397 days.

(21) Appl. No.: 12/009,663

(22) Filed: Jan. 22, 2008

Related U.S. Application Data

(60) Provisional application No. 60/994,618, filed on Sep. 20, 2007.

(51) Int. Cl.
*G11C 11/34* (2006.01)

(52) U.S. Cl. ............ 365/185.01; 257/316; 365/185.26; 365/185.28

(58) Field of Classification Search ............ 257/316; 365/185.01, 185.26, 185.28
See application file for complete search history.

(56) References Cited

U.S. PATENT DOCUMENTS

| | | | | |
|---|---|---|---|---|
| 5,267,194 | A * | 11/1993 | Jang | 365/185.15 |
| 6,222,759 | B1 * | 4/2001 | Chi-Hung | 365/185.01 |
| 6,348,710 | B1 * | 2/2002 | Igarashi | 257/314 |
| 6,819,594 | B2 | 11/2004 | Lee et al. | |
| 6,842,374 | B2 | 1/2005 | Lee et al. | |

OTHER PUBLICATIONS

Chung, et al.,"N-Channel Versus P-Channel Flash EEPROM-Which one has better reliabilities," IEEE 39th Annual International Reliability Physics Symp., Orlando, FL, 2001.
Lee, et al., "Self-Convergent Scheme for Logic-Process-Based Multilevel/Analog Memory," IEEE Transactions on Electron Devices, vol. 52, No. 12, Dec. 2005.

* cited by examiner

*Primary Examiner*—Dang T Nguyen
*Assistant Examiner*—Alexander Sofocleous
(74) *Attorney, Agent, or Firm*—Michael C. Stephens, Jr.

(57) ABSTRACT

Methods, circuits, processes, devices, and/or arrangements for providing a non-volatile memory (NVM) cell are disclosed. In one embodiment, an NVM cell can include: (i) a floating gate in a gate layer, where the floating gate is over an insulating layer, and the insulating layer is over a first channel between first and second diffusion regions; and (ii) a control gate in the gate layer, where the control gate is configured to control the floating gate using direct sidewall capacitive coupling, and where a first coupling ratio from the direct sidewall capacitive coupling is greater than a second coupling ratio from the second diffusion region.

18 Claims, 6 Drawing Sheets

LOW VOLTAGE LOW COST NON-VOLATILE MEMORY

RELATED APPLICATIONS

This application claims the benefit of U.S. Provisional Application No. 60/994,618, filed on Sep. 20, 2007, incorporated herein by reference in its entirety.

FIELD OF THE INVENTION

The present invention generally relates to the field of semiconductor memories. More specifically, embodiments of the present invention pertain to methods, circuits, processes, devices, and/or arrangements for providing a non-volatile memory (NVM) cell.

DISCUSSION OF THE BACKGROUND

Non-volatile memory (e.g., electrically erasable programmable read-only memory (EEPROM) and flash, etc.) are in widespread use in the industry today. Such devices are used in compact flash cards for digital cameras, memory sticks, jump drives, EEPROM chips for booting-up devices (e.g., basic input/output system (BIOS)), and many other applications. Such devices in mass production generally have cells formed by two polysilicon ("poly") layers, where a first poly layer is used as a floating gate (FG), and a second poly layer is used as a control gate (CG). The control gate may be capacitively coupled to the floating gate using an oxide-nitride-oxide (ONO) layer, which is deposited in between the two poly layers.

Two different approaches are generally used for programming and erasing flash memory devices, and typically based on whether the flash is NAND or NOR type. In a NAND flash, memory cell programming and erasing is done using Fowler-Nordheim (F-N) tunneling through the tunnel oxide below the floating gate. In a NOR flash device, programming is done using channel hot electron (CHE) injection, while erasing is done using the Fowler-Nordheim tunneling through the tunnel oxide. However, both of these approaches suffer from increased cost and process complexity, primarily due to the second poly layer and the ONO structure. In addition, F-N tunneling generally requires high voltages (e.g., in the 14 V to 18 V range), resulting in greater power consumption, complexity, and cost (e.g., due to high voltage compatible transistors).

Other conventional approaches utilize a single poly layer in EEPROM memory cells. In these devices, the floating gate may be coupled using a well (e.g., NWELL or PWELL) or diffusion (e.g., N+ or P+), and instead of using a second poly layer to form the control gate. The program and erase functions can be performed using either hot electrons or F-N tunneling, as discussed above with reference to NAND and NOR type flash devices. One disadvantage of using well or diffusion coupling is the associated increase in area and memory cell size. Therefore, integrated circuit (IC) implementations using these approaches are typically limited to a few thousand cells before the area penalty becomes prohibitive. Further, when using N+ diffusion to couple to the floating poly gate, the N+ junction has to be optimized as relatively deep and with a large overlap to the floating poly gate to achieve good coupling. This makes it difficult to scale to shorter channel lengths and more advanced technologies.

SUMMARY OF THE INVENTION

Embodiments of the present invention relate to methods, circuits, processes, devices, and/or arrangements for providing a non-volatile memory (NVM) cell.

In one embodiment, an NVM cell can include: (i) a floating gate in a gate layer, where the floating gate is over an insulating layer, and the insulating layer is over a first channel between first and second diffusion regions; and (ii) a control gate in the gate layer, where the control gate is configured to control the floating gate using direct sidewall capacitive coupling, and where a first coupling ratio from the direct sidewall capacitive coupling is greater than a second coupling ratio from the second diffusion region.

In another embodiment, a method of erasing an NVM cell can include the steps of: (i) applying a first fixed voltage on a drain of the NVM cell; (ii) applying a second fixed voltage on a source of the NVM cell; and (iii) ramping down a voltage on a control gate of the NVM cell from a first voltage level to a second voltage level, where the voltage on the control gate is sufficient to produce channel-induced hot holes (CHH) through an insulating layer of the NVM cell.

In another embodiment, an electrically erasable programmable read-only memory (EEPROM) device can include: (i) a controller configured to control programming, erasing, and reading of a memory portion; and (ii) the memory portion having a plurality of NVM cells, where each NVM cell can include: (a) a floating gate in a gate layer, where the floating gate is over an insulating layer, and where the insulating layer is over a first channel between first and second diffusion regions; and (b) a control gate in the gate layer, where the control gate is configured to control the floating gate using direct sidewall capacitive coupling, and where a first coupling ratio from the direct sidewall capacitive coupling is greater than a second coupling ratio from the second diffusion region.

Embodiments of the present invention can advantageously provide a low cost NVM cell by using a single poly layer in the memory cell. Further, embodiments of the present invention can operate at relatively low voltages by using a CHH erase mechanism, thus reducing power consumption over conventional approaches. These and other advantages of the present invention will become readily apparent from the detailed description of preferred embodiments below.

DETAILED DESCRIPTION OF THE PREFERRED EMBODIMENTS

Figure 1:
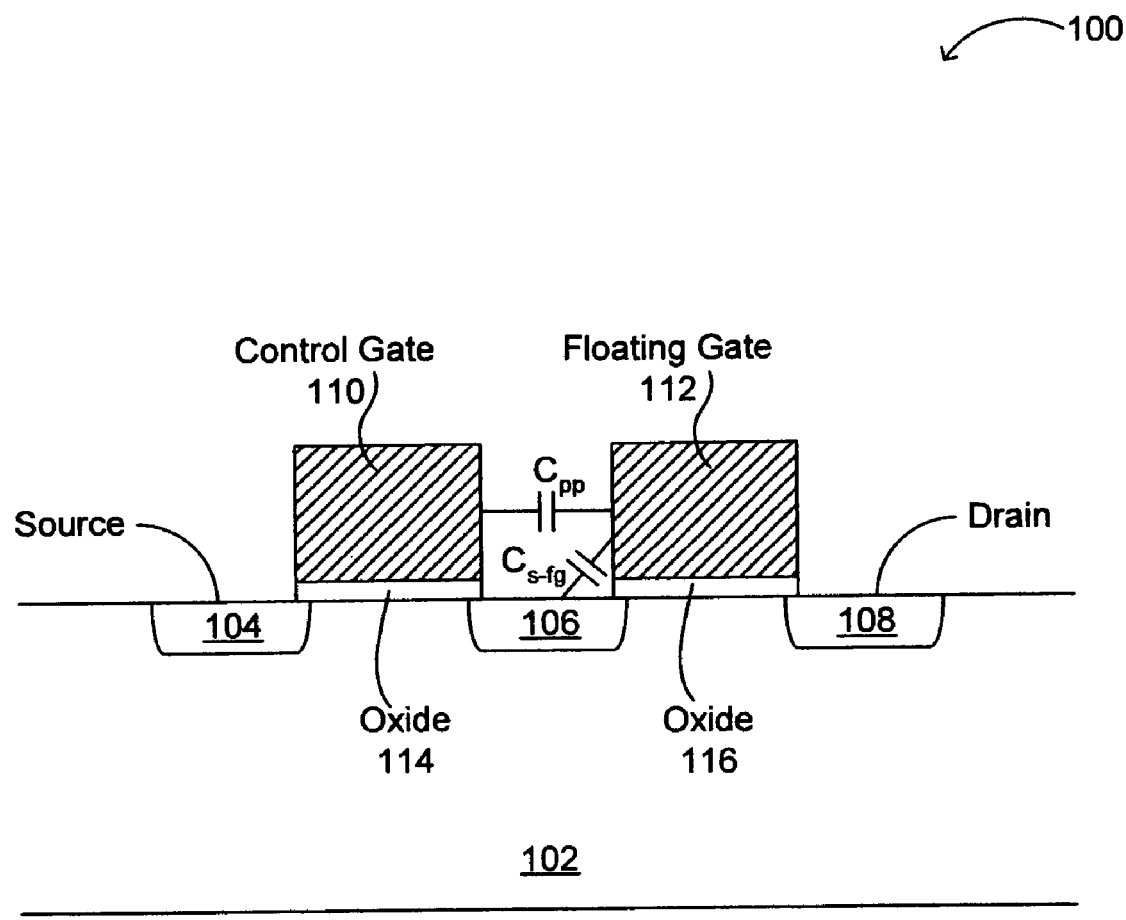
FIG. 1 is a cross-section diagram of an example non-volatile memory (NVM) cell in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, schematic symbols, and other symbolic representations of operations on code, data bits, data streams, signals, or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

A low cost non-volatile memory (NVM) cell that can also be operated at relatively low voltages is described herein. This cell in particular embodiments uses poly-to-poly capacitive coupling between neighboring poly lines. One of these poly lines may not be contacted, and is therefore the floating gate (FG). The other poly line may be the control gate (CG), which controls the voltage on the floating gate using direct capacitive coupling. In alternative embodiments, the control gate poly line can be routed on both active and isolation (i.e., field) regions, or on a field region only. Further, certain embodiments can employ channel hot electron (CHE) injection for programming the cell, and channel-induced hot holes (CHH) for erasing the cell.

The invention further relates to hardware implementations of the present architecture, method and circuit. Embodiments of the present invention can advantageously provide a low cost NVM cell by using a single poly layer in the memory cell. Further, embodiments of the present invention can operate at relatively low voltages by using a CHH erase mechanism, thus reducing power consumption over conventional approaches. The invention, in its various aspects, will be explained in greater detail below with regard to exemplary embodiments.

Exemplary NVM Cell Structures

In one example, an NVM cell includes: (i) a floating gate in a gate layer, where the floating gate is over an insulating layer (e.g., an oxide layer), and the insulating layer is over a first channel between first and second diffusion regions; and (ii) a control gate in the gate layer, where the control gate is configured to control the floating gate using direct sidewall capacitive coupling, and where a first coupling ratio from the direct sidewall capacitive coupling is greater than a second coupling ratio from the second diffusion region.

Referring now to FIG. 1, a cross-section diagram of an example NVM cell 100 in accordance with embodiments of the present invention is shown. Control gate 110 may be over oxide 114, while floating gate 112 may be over oxide 116. In certain embodiments, any suitable insulating layer (e.g., a high-k dielectric, a combination of a high-k dielectric with an oxide, etc.) can be used instead of the oxide. For example, oxide 116 is a "tunnel" oxide because electrons and holes tunnel across this oxide when charging or discharging floating gate 112. In this fashion, programming and erasing of the memory cell, as will be discussed in more detail below, is accommodated.

Region 102 may be P-type substrate or PWELL, while diffusion regions 104, 106, and 108 may be N-type. For example, the P-type substrate may have an abundance of holes by being lightly doped with trivalent atoms, such as boron, for a silicon wafer. Also, N-type diffusion regions 104 (e.g., source), 106, and 108 (e.g., drain), forming two transistor structures, may be heavily doped with valence-five atoms, such as phosphorus. Other combinations of materials (e.g., doping atoms), N/P type, and underlying substrate material (e.g., silicon-on-insulator (SOI) substrates) can also be used in particular embodiments.

In certain embodiments, direct sidewall capacitive coupling from the control gate to the floating gate (e.g., via capacitance $C_{pp}$ between poly lines 110 and 112) is used to control a voltage level on floating gate 112. As shown below in Equation 1, a coupling ratio may be defined as a particular capacitance component (C) over a total capacitance ($C_{total}$), where the sum of all such coupling ratios from all nodes in the cell is 1.0. Equation 2 shows a coupling ratio via a diffusion region (e.g., N-type diffusion region 106) component, while Equation 3 shows a coupling ratio from a gate-to-gate (e.g., control gate to floating gate) component, which is a direct sidewall capacitance component in particular embodiments.

General Coupling Ratio=$C/C_{total}$ (1)

N-type Diffusion Region Coupling Ratio=$C_{s-fg}/C_{total}$ (2)

Gate-to-Gate Coupling Ratio=$C_{pp}/C_{total}$ (3)

In certain embodiments, the N-type diffusion region coupling ratio (e.g., less than about 0.2, such as from about 0.02 to about 0.2, and more specifically about 0.12) of Equation 2 may be less than a predetermined ratio, while the poly-to-poly or gate-to-gate coupling ratio (e.g., greater than about 0.3) of Equation 3 may be greater than the predetermined ratio. For example, the gate-to-gate coupling ratio is in a range of from about 0.25 to about 0.9, including from about 0.3 to about 0.6, and more specifically in a range of from about 0.4 to about 0.45. In some embodiments, a gate-to-gate coupling ratio of about 0.45 or greater may be targeted, with a possible trade-off versus NVM cell size. In any case, a coupling ratio from N-type diffusion regions (e.g., Equation 2) is less than a gate-to-gate coupling ratio (e.g., Equation 3) due to direct coupling between the control gate and the floating gate in particular embodiments. This is in contrast to conventional approaches whereby a coupling ratio from N-type diffusion regions (e.g., Equation 2) may have to be fairly large (e.g., about 0.4) because such a ratio being about 0.2 or less may not allow the floating gate to couple enough voltage to program and erase the conventional NVM cell.

In this fashion, a floating gate voltage in particular embodiments may be controlled by a control gate substantially via direct sidewall (e.g., poly-to-poly) capacitive coupling, as opposed to relying on capacitive components via one or two N-type diffusion regions. For example, a floating gate voltage can be related to a control gate voltage via the coupling ratio of Equation 3, as shown below in Equation 4.

$V_{FG}=V_{CG}*C_{pp}/C_{total}$ (4)

Thus in particular embodiments, a coupling ratio from a direct sidewall gate-to-gate capacitance (e.g., Equation 3) is greater than, and possibly substantially greater than, a corresponding component from the N-type diffusion regions (e.g., Equation 2). Further, the predetermined ratio and other coupling ratios may be dependent on a variety of process parameters and/or variables. In addition, it is generally desirable to increase $C_{pp}$ while maintaining control gate 110 and floating gate 112 in the same layer (e.g., a first polysilicon layer). For example, $C_{pp}$ can be increased by adding materials having an intrinsically higher dielectric constant (k) to the dielectric separating control gate 110 from floating gate 112. For example, $Al_2O_3$ and $HfSiO_2$ are among the high-k materials that can be utilized to accordingly improve $C_{pp}$.

Tunnel oxide 116 may have a nominal thickness of about 70 Å, depending on particular process implementations or other variations. For example, a thickness of tunnel oxide 116 in certain embodiments may be in a range of from about 40 Å to about 90 Å, such as from about 60 Å to about 80 Å, and more specifically about 70 Å. Such oxide thicknesses may also be reduced as associated process technology advances. In addition, other insulating/dielectric layers, such as the high-k materials or a combination of high-k materials and $SiO_2$, can also be employed in the tunnel oxide.

In certain embodiments, control gate 110 and floating gate 112 may be implemented using polysilicon. However, control gate 110 and/or floating gate 112 may be replaced by other conductive materials, such as metals. Further, high-k materials and metal gates may be of particular use in 45 nm and more advanced process technologies.

Figure 2:
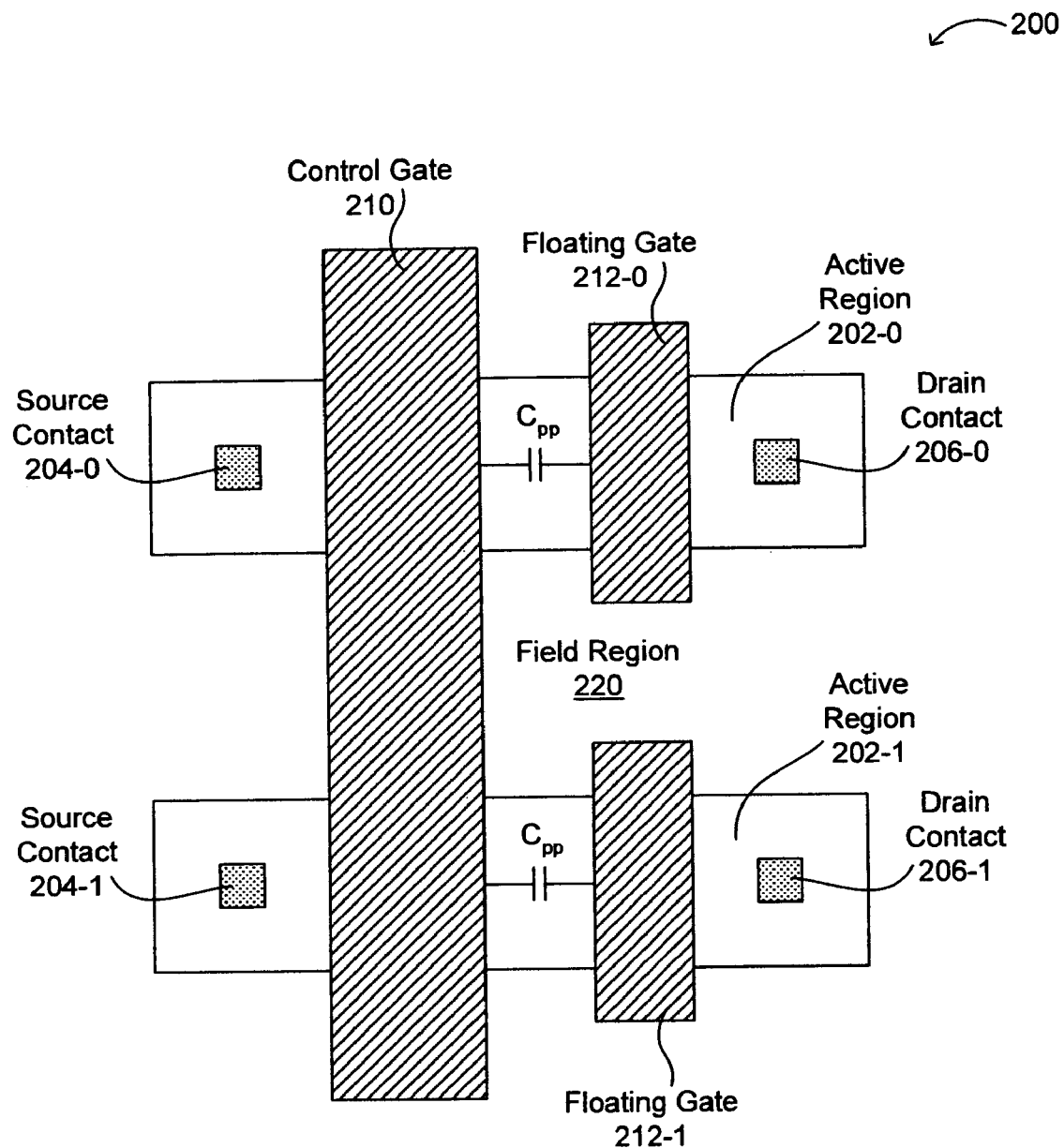
FIG. 2 is a layout view of an example NVM cell pair with control gate on both active and field regions in accordance with embodiments of the present invention.
Figure 3:
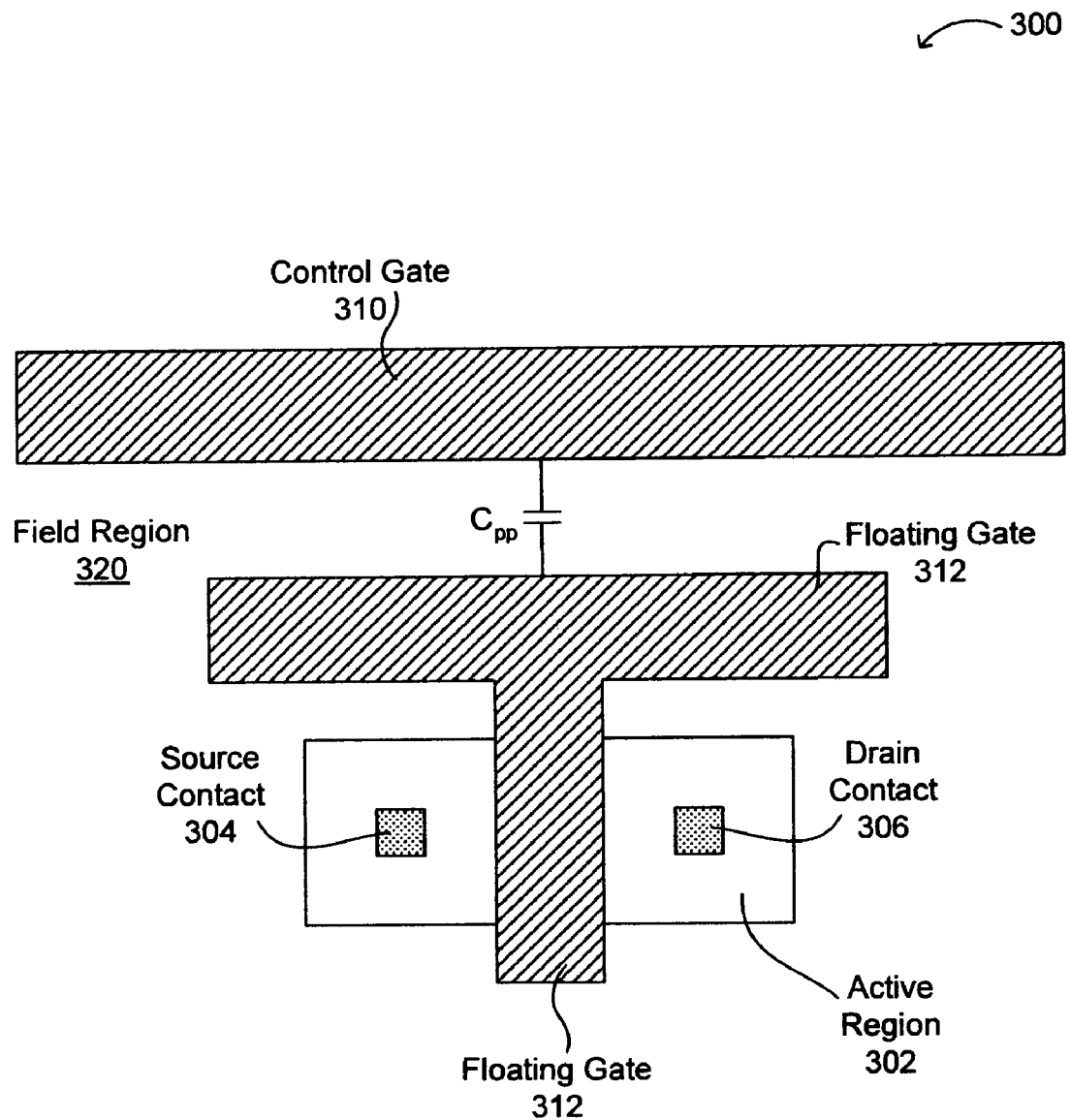
FIG. 3 is a layout view of an example NVM cell with control gate over field in accordance with embodiments of the present invention.

As discussed above, an NVM cell in particular embodiments uses poly-to-poly direct capacitive coupling between two neighboring poly lines ($C_{pp}$). In this fashion, the control gate controls the voltage on the floating gate using the direct capacitive coupling. Further, the control gate poly line can generally: (i) cover both active and isolation/field regions; or (ii) cover an isolation region only. FIGS. 2 and 3 show particular example layouts of these general cases, but other suitable variations can also be accommodated in particular embodiments.

Referring now to FIG. 2, a layout view of an example NVM cell pair 200 with control gate on both active and field regions in accordance with embodiments of the present invention is shown. Control gate 210 may be a continuous line across multiple cells and field region 220, as shown. One cell (e.g., formed with active region 202-0) may have floating gate 212-0, while an adjacent cell (e.g., formed with active region 202-1) may have floating gate 212-1, where each floating gate is substantially parallel to control gate 210 in this example, and where each floating gate extends over the corresponding active region by about a minimum feature size. Thus, each floating gate (e.g., 212-0 and 212-1) may be coupled to control gate 210 by the respective poly-to-poly capacitance ($C_{pp}$). In addition, source connections (e.g., via source contacts 204-0 and 204-1) and drain connections (e.g., via drain contacts 206-0 and 206-1) can be used for appropriate cell connections, such as to bit line and ground supplies.

Referring now to FIG. 3, a layout view of an example NVM cell 300 with control gate over field in accordance with embodiments of the present invention is shown. Here, floating gate 312 may have a first portion overlapping active region 302, and a second portion over field region 320. In this particular example, control gate 310 may be substantially parallel to the second portion of the floating gate 312, for providing capacitance $C_{pp}$. Of course, other layouts or shapes of the second portion of the floating gate 312 and control gate 310 can also be accommodated in particular embodiments. In addition, source connections (e.g., via source contact 304) and drain connections (e.g., via drain contact 306) can be used for appropriate cell connections, such as to bit line and ground supplies.

Generally, good capacitive coupling (e.g., $C_{pp}$) can be achieved when the spacing between the control gate and the floating gate is less than about 150 nm. However, any suitable spacing can be used. For example, a poly-to-poly spacing in certain embodiments may be in a range of from about 30 nm to about 150 nm, such as from about 65 nm to about 110 nm, including from about 80 nm to about 100 nm, and more specifically about 90 nm. Generally, a spacing between the control gate and the floating gate can be about twice a minimum feature size for a particular process technology.

Exemplary NVM Operation

Voltage may be applied to the control gate, the source, and the drain of the NVM cell in order to perform programming, erasing, and/or reading of the cell. Programming and erasing can be done using combinations of Fowler-Nordheim (F-N) tunneling, channel hot electron (CHE) injection, and/or channel-induced hot holes (CHH) methods.

In one example, a method of erasing an NVM cell includes the steps of: (i) applying a first fixed voltage on a drain of the NVM cell; (ii) applying a second fixed voltage on a source of the NVM cell; and (iii) ramping down a voltage on a control gate of the NVM cell from a first voltage level to a second voltage level, where the voltage on the control gate is sufficient to produce CHH through an insulating layer (e.g., a tunnel oxide) of the NVM cell.

Figure 4:
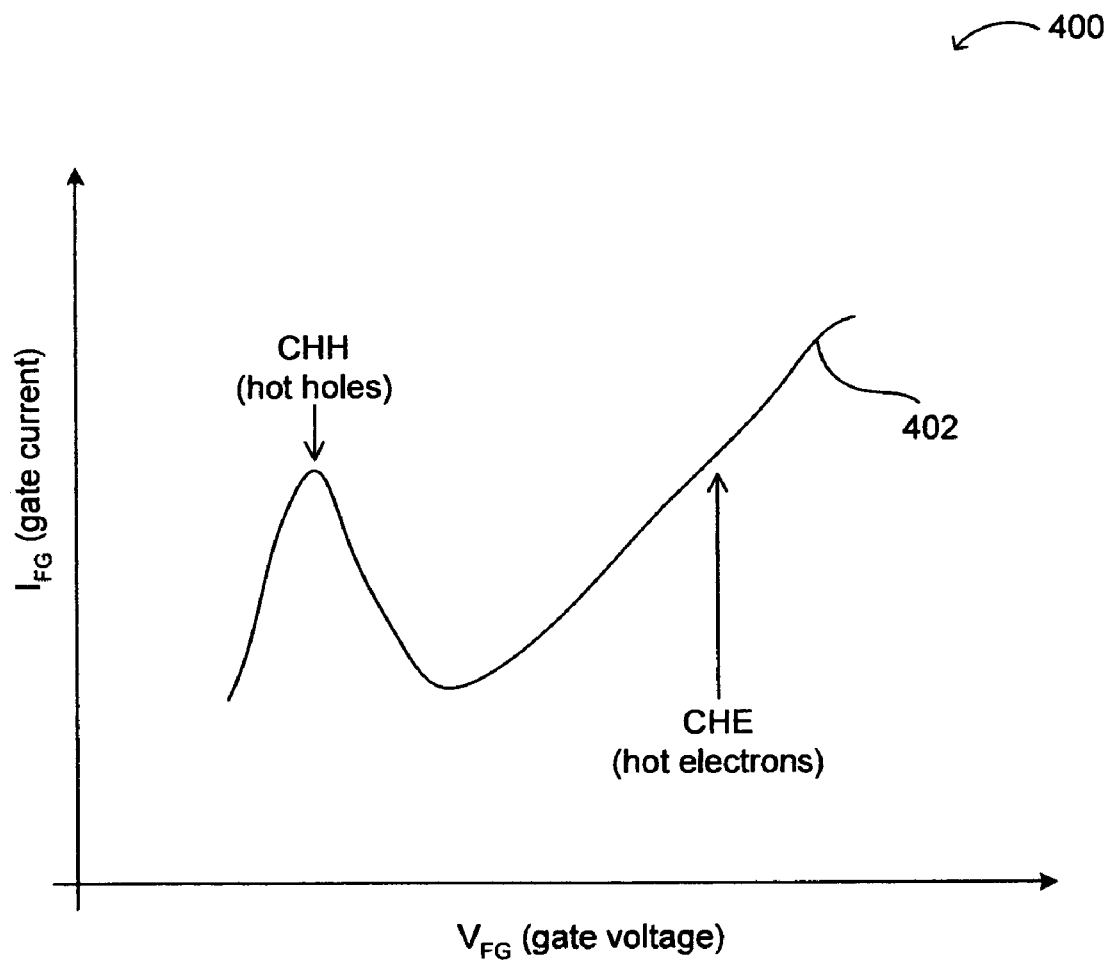
FIG. 4 is an example floating gate current plot suitable for use in accordance with embodiments of the present invention.

Referring now to FIG. 4, an example floating gate current plot 400 suitable for use in accordance with embodiments of the present invention is shown. Gate current ($I_{FG}$) as a function of the floating gate voltage ($V_{FG}$) is shown as waveform 402, with erasing occurring using CHH injection, and programming occurring using CHE injection. Example voltages for cell operation in program, erase, and read modes, are shown below in Table 1. These example voltages can be applied to place the NVM cell in a CHE injection region for programming, and CHH injection region for erasing. Further, erasing using CHH in particular embodiments can employ a voltage ramping (e.g., a ramp down) on the control gate for improved performance. For example, such ramping can be accomplished via a "staircase" function (e.g., having one or more steps in moving from a first voltage level to a second voltage level), or other suitable function.

TABLE 1

| Operation | Program (CHE) | Erase (CHH) | Read |
|---|---|---|---|
| $V_{CG}$ | 5.5 V | 2 V (ramp down $V_{CG}$ from 4 V to 1 V) | 1.8 V |
| $V_D$ (drain) | 5 V | 5 V | 1.0 |
| $V_S$ (source) | 0 V | 0 V | 0 V |

The operating voltages shown in Table 1 may vary depending on the technology used, and also due to implant optimization on sources, drains, lightly doped drains (LDD), and halo implantations for the floating gate. In certain embodiments, LDD and halo implants may be optimized to achieve sufficient CHE/CHH generation at $V_D$ in a range of from about 4 V to about 4.5 V. In addition, a ramp of the $V_{CG}$ during programming (e.g., CHE injection), such as from about 4 V to about 6 V, can also provide some advantages to cell reliability at the expense of more circuit complexity in achieving this ramp. However, a single programming voltage on $V_{CG}$ is also suitable for effective operation in certain embodiments.

In particular embodiments, the operating voltages shown above in Table 1 can be any suitable values within appropriate ranges for certain technologies and/or design approaches. For example, programming voltages can include a $V_{CG}$ range of from about 4 V to about 8 V, a $V_D$ range of from about 4 V to about 7 V, and a $V_S$ range of from about −0.5 V to about +0.5 V. For example, erasing voltages can include a $V_{CG}$ range of from about +5 V to about −1 V, a $V_D$ range of from about 4 V to about 7 V, and a $V_S$ range of from about −0.5 V to about +0.5 V. For example, reading voltages can include a $V_{CG}$ range of from about 0.5 V to about 3.3 V, a $V_D$ range of from about 0.25 V to about 1.5 V, and a $V_S$ range of from about 0 V to about +1 V.

Figure 5:
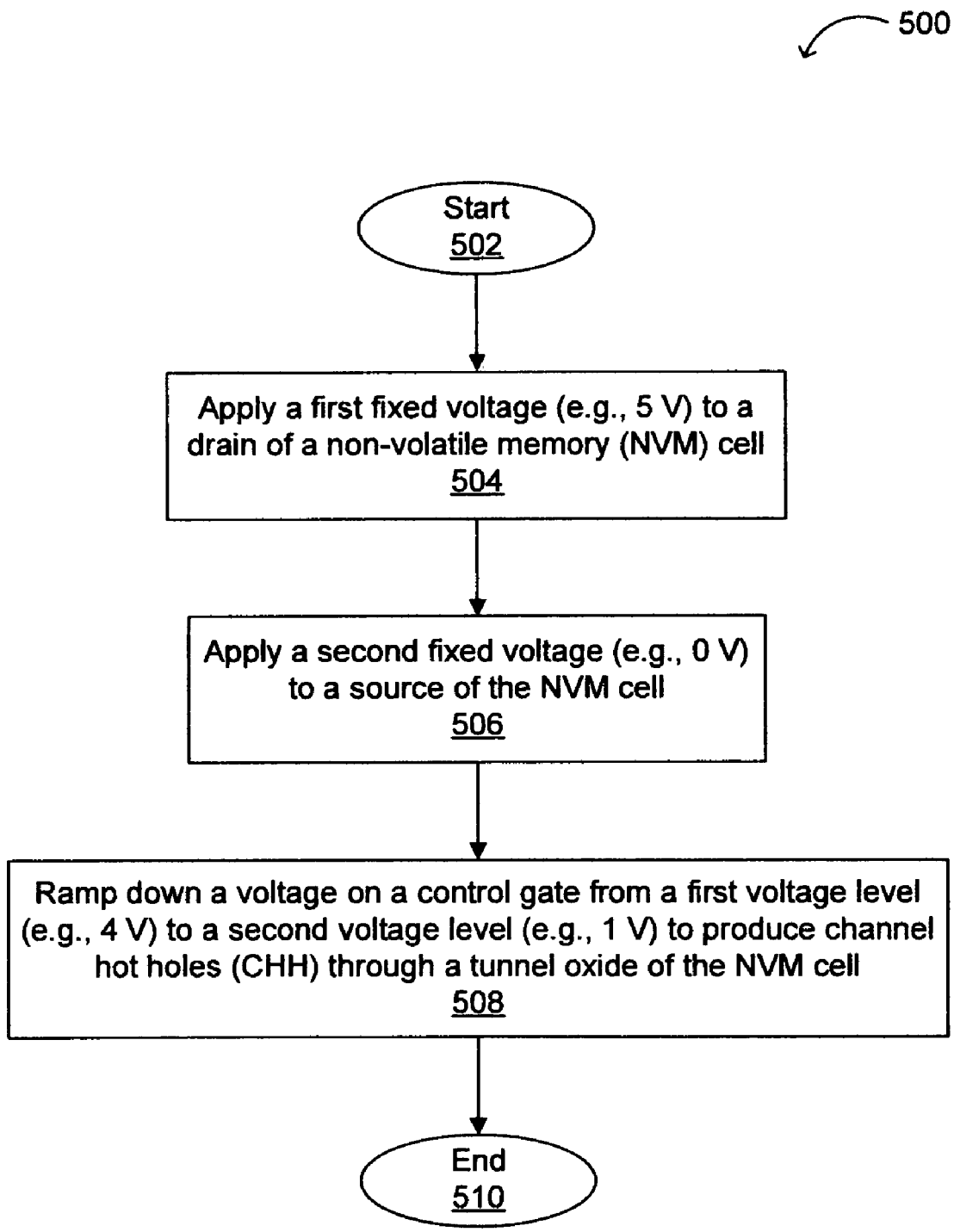
FIG. 5 is a flow diagram of an example method of erasing an NVM cell in accordance with embodiments of the present invention.

Referring now to FIG. 5, a flow diagram of an example method 500 of erasing an NVM cell in accordance with embodiments of the present invention is shown. The flow can begin (502), and a first fixed voltage (e.g., about 5 V) may be applied to a drain ($V_D$) of the NVM cell (504). Simultaneously or sequentially, a second fixed voltage (e.g., about 0 V) may be applied to a source ($V_S$) of the NVM cell (506). Simultaneously or sequentially, a voltage on a control gate can be ramped down from a first voltage level (e.g., about 4 V) to a second voltage level (e.g., about 1 V) to produce CHH through a tunnel oxide of the NVM cell (508), completing the flow (510). For example, this ramping can be done using a staircase type function, or another suitable transition (e.g., in one or more steps) from the first voltage level to the second voltage level.

Exemplary NVM Cell Applications

In one example, an electrically erasable programmable read-only memory (EEPROM) device includes: (i) a controller configured to control programming, erasing, and reading of a memory portion; and (ii) the memory portion having a plurality of NVM cells, where each NVM cell can include: (a) a floating gate in a gate layer, where the floating gate is over an insulating layer, and where the insulating layer is over a first channel between first and second diffusion regions; and (b) a control gate in the gate layer, where the control gate is configured to control the floating gate using direct sidewall capacitive coupling, and where a first coupling ratio from the direct sidewall capacitive coupling is greater than a second coupling ratio from the second diffusion region.

Figure 6:
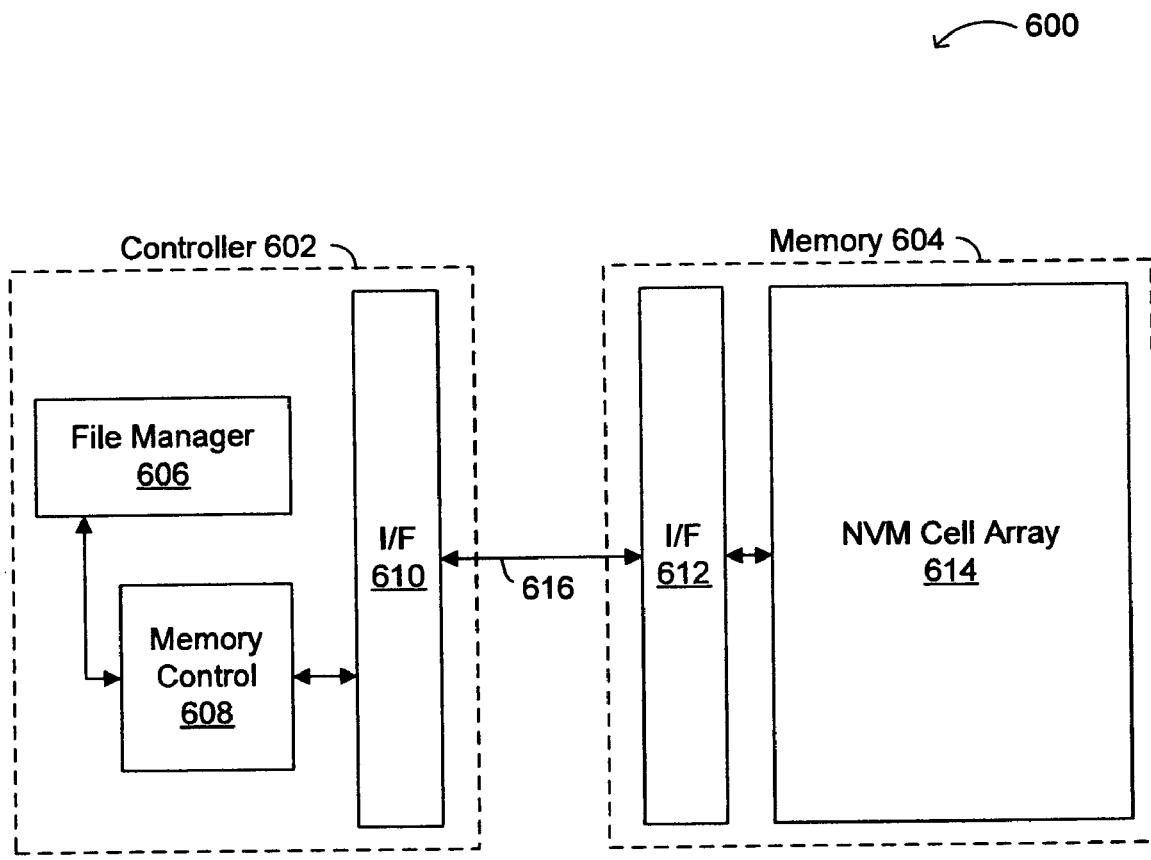
FIG. 6 is a block diagram of an example NVM cell array application in accordance with embodiments of the present invention.

Referring now to FIG. 6, a block diagram of an example NVM cell array application 600 in accordance with embodiments of the present invention is shown. For example, 600 is a memory stick application that incorporates non-volatile memory and a controller. Controller 602 (e.g., a host controller) can include file manager 606, memory control block 608, and interface 610. Memory 604 (e.g., an EEPROM), can include NVM cell array 614 and interface 612. For example, NAND or NOR arrangements of NVM cells as described herein can be used to form NVM cell array 614. Interfaces 610 and 612 can communicate over signal 616, which can include serial and/or parallel interface support, to provide clocking, address selection, data interfacing, and command control (e.g., read, program, erase). Other components can include a data buffer, registers, error correction circuitry, and voltage supply circuitry.

In this fashion, an NVM cell with direct poly-to-poly sidewall capacitive coupling, and formed using a single polysilicon layer can be provided. Further, CHE may be used in cell programming, while CHH (e.g., with ramped $V_{CG}$ control) can be used in cell erasing. Such CHH injection can also be used for erasing NVM cells constructed with standard 2-poly ONO, allowing for low voltage erasing, but at the cost of a more complex process versus the single poly cell described herein.

While the above examples include silicon implementations of NVM cells, one skilled in the art will recognize that other technologies, such as silicon-on-insulator (SOI) may also be used in accordance with embodiments. Further, one skilled in the art will recognize that other layout arrangements and the like may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A non-volatile memory (NVM) cell, comprising:
   a) a floating gate in a gate layer, said floating gate being partially over a first insulating layer, said first insulating layer being over a first channel between first and second diffusion regions; and
   b) a control gate in said gate layer, wherein said control gate is configured to control said floating gate using direct sidewall capacitive coupling, and wherein a first coupling ratio from said direct sidewall capacitive coupling is greater than a second coupling ratio from said second diffusion region.

2. The NVM cell of claim 1, wherein said insulating layer comprises oxide.

3. The NVM cell of claim 1, wherein said gate layer comprises polysilicon.

4. The NVM cell of claim 1, wherein said gate layer comprises metal.

5. The NVM cell of claim 1, wherein said first coupling ratio is greater than about 0.3.

6. The NVM cell of claim 1, wherein said second coupling ratio is less than about 0.2.

7. The NVM cell of claim 1, wherein a minimum spacing between said floating gate and said control gate is about twice a minimum feature size.

8. The NVM cell of claim 1, wherein said control gate is over second and third insulating layers, said second insulating layer being over a second channel between said second and a third diffusion regions.

9. The NVM cell of claim 8, wherein said first insulating layer is a tunnel oxide.

10. The NVM cell of claim 8, wherein said third insulating layer is a field oxide.

11. The NVM cell of claim 8, wherein said first diffusion region is a drain and said third diffusion region is a source.

12. The NVM cell of claim 1, wherein:
   a) a first portion of said floating gate is arranged substantially over an active transistor region;
   b) a second portion of said floating gate is arranged substantially over a field region; and
   c) said control gate is over said field region and substantially parallel to said second portion of said floating gate.

13. The NVM cell of claim 1, wherein said control gate is configured to span across a plurality of active regions and field regions, and wherein said floating gate is substantially parallel to said control gate.

14. The NVM cell of claim 1, configured to be programmed using channel hot electrons (CHE) through said first insulating layer.

15. The NVM cell of claim 1, configured to be erased using channel-induced hot holes (CHH) through said first insulating layer.

16. The NVM cell of claim 15, further configured to be erased by ramping down a voltage on said control gate.

17. An electrically erasable programmable read-only memory (EEPROM) device, comprising:
   a) a controller configured to control programming, erasing, and reading of a memory portion; and
   b) said memory portion having a plurality of non-volatile memory (NVM) cells, wherein each said NVM cell comprises: (i) a floating gate in a gate layer, said floating gate being over an insulating layer, said insulating layer being over a first channel between first and second diffusion regions; and (ii) a control gate in said gate layer, wherein said control gate is configured to control said floating gate using direct sidewall capacitive coupling, and wherein a first coupling ratio from said direct sidewall capacitive coupling is greater than a second coupling ratio from said second diffusion region.

18. The EEPROM device of claim 17, wherein said erasing comprises using channel-induced hot holes (CHH) through said insulating layer.

* * * * *